United States Patent
Seo (10) Patent No.: US 11,239,505 B2
(45) Date of Patent: Feb. 1, 2022

(54) APPARATUS AND METHOD FOR ESTIMATING CAPACITY RETENTION RATIO OF SECONDARY BATTERY

(71) Applicant: LG CHEM, LTD., Seoul (KR)

(72) Inventor: Se-Wook Seo, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 423 days.

(21) Appl. No.: 16/336,638

(22) PCT Filed: Jun. 14, 2018

(86) PCT No.: PCT/KR2018/006717
§ 371 (c)(1),
(2) Date: Mar. 26, 2019

(87) PCT Pub. No.: WO2019/009530
PCT Pub. Date: Jan. 10, 2019

(65) Prior Publication Data
US 2021/0288355 A1    Sep. 16, 2021

(30) Foreign Application Priority Data

Jul. 6, 2017    (KR) .................. 10-2017-0085996

(51) Int. Cl.
*H01M 10/42* (2006.01)
*G01R 31/387* (2019.01)
(Continued)

(52) U.S. Cl.
CPC .... *H01M 10/4257* (2013.01); *G01R 31/3648* (2013.01); *G01R 31/374* (2019.01);
(Continued)

(58) Field of Classification Search
CPC ......... H01M 10/4257; H01M 10/4285; H01M 10/482; H01M 10/486; H01M 2010/4271;
(Continued)

(56) References Cited

U.S. PATENT DOCUMENTS

2005/0024020 A1    2/2005    Hogari et al.
2010/0036626 A1    2/2010    Kang et al.
(Continued)

FOREIGN PATENT DOCUMENTS

CN    1601296 A    3/2005
CN    103308864 A    9/2013
(Continued)

OTHER PUBLICATIONS

International Search Report for PCT/KR2018/006717 dated Sep. 13, 2018.

*Primary Examiner* — Victoria H Lynch
(74) *Attorney, Agent, or Firm* — Birch, Stewart, Kolasch & Birch, LLP (57) ABSTRACT

An apparatus for estimating a capacity retention rate of a secondary battery from a degree of calendar aging and a degree of cycle aging of the secondary battery included in a battery pack, including a control unit that receives current information and temperature information of the secondary battery from a sensing unit installed in the battery pack in each cycle having a preset time length, and performs a first main process and a second main process in a sequential order, a memory that stores a predetermined weighting factor, and further stores a state of charge, a degree of cycle aging and a degree of calendar aging of the secondary battery updated in each cycle when the first main process is performed.

11 Claims, 6 Drawing Sheets

(51) Int. Cl.
  *G01R 31/374* (2019.01)
  *G01R 31/36* (2020.01)
  *H01M 10/48* (2006.01)

(52) U.S. Cl.
  CPC ...... *G01R 31/387* (2019.01); *H01M 10/4285* (2013.01); *H01M 10/482* (2013.01); *H01M 10/486* (2013.01); *H01M 2010/4271* (2013.01)

(58) Field of Classification Search
  CPC . G01R 31/387; G01R 31/374; G01R 31/3648
  See application file for complete search history.

(56) References Cited

U.S. PATENT DOCUMENTS

| | | | |
|---|---|---|---|
| 2010/0324846 A1* | 12/2010 | Marsh | H01M 10/48 702/63 |
| 2013/0041538 A1 | 2/2013 | Jin et al. | |
| 2014/0009123 A1 | 1/2014 | Park et al. | |
| 2015/0226809 A1* | 8/2015 | Joe | G01R 31/367 324/426 |
| 2015/0268307 A1 | 9/2015 | Inguva et al. | |
| 2015/0280294 A1 | 10/2015 | Shin et al. | |
| 2018/0059192 A1 | 3/2018 | Seo et al. | |

FOREIGN PATENT DOCUMENTS

| | | |
|---|---|---|
| CN | 103930298 A | 7/2014 |
| CN | 104931889 A | 9/2015 |
| CN | 104931891 A | 9/2015 |
| JP | 2000-12098 A | 1/2000 |
| JP | 2002-228730 A | 8/2002 |
| JP | 2015-158416 A | 9/2015 |
| KR | 10-0911317 B1 | 8/2009 |
| KR | 10-2010-0019249 A | 2/2010 |
| KR | 10-2013-0083220 A | 7/2013 |
| KR | 10-1293630 B1 | 8/2013 |
| KR | 10-2016-0051047 A | 5/2016 |
| KR | 10-2017-0022746 A | 3/2017 |

* cited by examiner

FIG. 1

Related Art

APPARATUS AND METHOD FOR ESTIMATING CAPACITY RETENTION RATIO OF SECONDARY BATTERY

TECHNICAL FIELD

The present disclosure relates to an apparatus and method for estimating a capacity retention rate of a secondary battery, and more particularly, to an apparatus and method for estimating a capacity retention rate of a secondary battery in comprehensive consideration of the degree of cycle aging and the degree of calendar aging of the secondary battery.

The present application claims priority to Korean Patent Application No. 10-2017-0085996 filed on Jul. 6, 2017 in the Republic of Korea, the disclosure of which is incorporated herein by reference.

BACKGROUND ART

Secondary batteries generate electrical energy through electrochemical oxidation and reduction reactions, and have a wide range of applications. In general, a secondary battery has a structure in which a packaging containing an electrode assembly and an electrolyte is sealed with two electrode terminals having different polarities being exposed to the outside. The electrode assembly includes a plurality of unit cells, and each unit cell is structured such that a porous separator is interposed at least between a negative electrode plate and a positive electrode plate. The negative electrode plate and the positive electrode plate are coated with active materials involved in electrochemical reactions, and the secondary battery is charged or discharged by electrochemical reactions between the active materials and the electrolyte.

The maximum capacity of the secondary battery is not continuously maintained at a design capacity, and it reduces with the calendar time or the cycle time. Here, the calendar time refers to the cumulative time for which the secondary battery is not charged/discharged and keeps in a no-load condition, and the cycle time refers to the cumulative time for which the secondary battery is charged/discharged.

The secondary battery ages not only while the secondary battery is being charged/discharged, i.e., cycle state, but also while the secondary battery is not being charged/discharged, i.e., calendar state. It is because the secondary battery is discharged very slowly through self-discharge even in a no-load condition.

The secondary battery ages faster in cycle state than in calendar state. It is because when the secondary battery is in cycle state, the electrolyte degrades faster due to heat generated from the secondary battery and the active material coated on the electrode plate degrades faster during intercalation or deintercalation of working ions (Li ions in the case of a lithium battery) to/from the electrode plate.

The degree of aging of the secondary battery may be determined by measuring the maximum capacity of the secondary battery and calculating how much difference is between the measured maximum capacity and the design capacity.

For reference, the actual maximum capacity of the secondary battery may be calculated by integrating the charge current of the secondary battery from the time the secondary battery is fully discharged to the time the secondary battery is fully charged. Alternatively, the actual maximum capacity of the secondary battery may be calculated by integrating the discharge current of the secondary battery from the time the secondary battery is fully charged to the time the secondary battery is fully discharged.

However, there are few cases in which the secondary battery is fully charged or discharged in an environment in which the secondary battery is actually used, so it is difficult to accurately determine the maximum capacity of the secondary battery.

Figure 1:
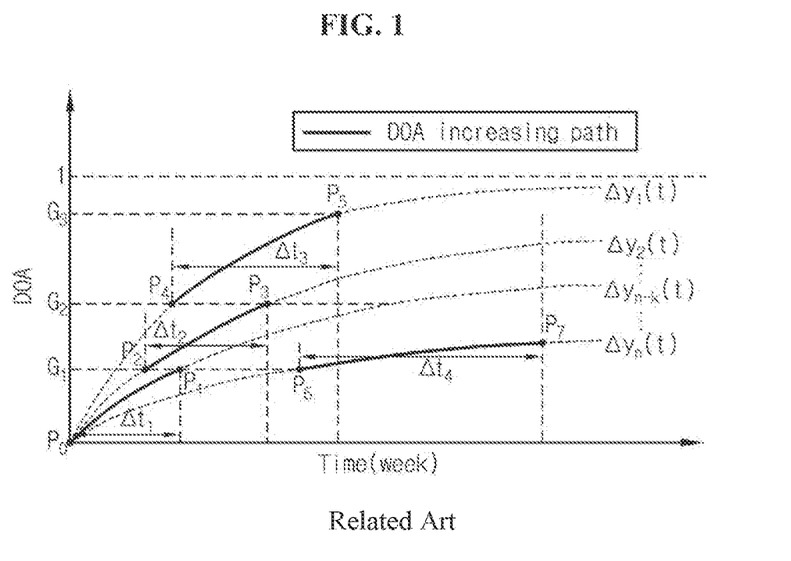
FIG. 1 is a graph showing a plurality of degree-of-aging profiles used for a degree-of-aging estimation model according to related art to estimate the degree of aging of a secondary battery.

To solve the above-described problem, a degree-of-aging estimation model has been disclosed. As shown in FIG. 1, the degree-of-aging estimation model includes a plurality of degree-of-aging profiles $\Delta y_1(t), \Delta y_2(t) \ldots \Delta y_n(t)$ predefined according to the operation state of the secondary battery (for example, the state of charge (SOC), the temperature, and the current rate). For example, $\Delta y_1(t), \Delta y_2(t), \ldots \Delta y_k(t)$ may be degree-of-aging profiles corresponding to different cycle states, and $\Delta y_{k+1}(t), \Delta y_{k+2}(t), \ldots \Delta y_n(t)$ may be degree-of-aging profiles corresponding to different calendar states.

The degree-of-aging estimation model is based on the processes of identifying the operation state in each predetermined cycle during the operation of the secondary battery, selecting a degree-of-aging profile corresponding to the identified operation state, and determining the degree of aging at the present time point using the selected degree-of-aging profile.

Referring to FIG. 1, when the secondary battery having the same maximum capacity as the design capacity keeps in cycle state as a first operation state (for example, cycle state) matched to $\Delta y_{n-k}(t)$ (where $1 \leq k \leq n-1$) during time $\Delta t_1$ from the initial time point, the degree of aging of the secondary battery increases from 0% corresponding to point $P_0$ to $G_1$% corresponding to point $P_1$. That is, the degree of aging of the secondary battery increases by $G_1$% during time $\Delta t_1$.

At the elapse of $\Delta t_1$ from the initial time point, when the operation state of the secondary battery is changed to a second operation state matched to $\Delta y_2(t)$, the degree of aging of the secondary battery increases along the curve $\Delta y_2(t)$ from $\Delta t_1$. In this case, since the degree of aging needs to consecutively increase, the start time of calculation of the degree of aging on $\Delta y_2(t)$ is point $P_2$ corresponding to $G_1$%. Hereinafter, in the changed degree-of-aging profile, a reference time point for an increase in the degree of aging, such as point $P_2$, is referred to as a reference equivalent time point.

When the second operation state is maintained during $\Delta t_2$, the degree of aging of the secondary battery increases from $G_1$% corresponding to point $P_2$ to $G_2$% corresponding to point $P_3$ along the solid line of the curve $\Delta y_2(t)$. That is, the degree of aging of the secondary battery increases by $(G_2-G_1)$% during $\Delta t_2$.

Furthermore, at the elapse of $\Delta t_1+\Delta t_2$ from the initial time point, when the operation state of the secondary battery is changed to a third operation state matched to $\Delta y_1(t)$, the degree of aging of the secondary battery increases along the curve $\Delta y_1(t)$ from $\Delta t_1+\Delta t_2$. Since the degree of aging needs to consecutively increase, the reference equivalent time point on $\Delta y_1(t)$ is changed to the time corresponding to point $P_4$.

When the third operation state is maintained during $\Delta t_3$, the degree of aging of the secondary battery increases from $G_2$% corresponding to point $P_4$ to $G_3$% corresponding to point $P_5$.

Each time the operation state of the secondary battery changes in this way, the following process is iteratively performed: selecting a degree-of-aging profile that matches to the changed operation state, determining a reference equivalent time point, which corresponds to an immediately previously integrated degree of aging, on the selected degree-of-aging profile, and while the changed operation state is maintained, updating the degree of aging of the secondary battery using the selected degree of aging profile.

However, the degree-of-aging estimation model as shown in FIG. 1 does not estimate the degree of aging separately when the secondary battery is in cycle state and when the secondary battery is in calendar state, so there is a problem with a big difference between the estimated degree of aging and the actual degree of aging. It is because when the operation state of the secondary battery sharply changes at a particular time point, a difference between the slope of the degree-of-aging profile matched to the operation state immediately before the particular time point and the slope of the degree-of-aging profile matched to the operation state immediately after the particular time point is very large.

For example, referring to FIG. 1, the operation state of the secondary battery may change from the operation state matched to $\Delta y_1(t)$ to the operation state matched to $\Delta y_n(t)$ at a certain time point (e.g., $\Delta t_1$), and in this case, a slope difference between $\Delta y_1(t)$ and $\Delta y_n(t)$ at the above time point is very large. When the slope difference between the two degree-of-aging profiles each matched to the operation states immediately before and after a particular time point exceeds the threshold, the electrical and chemical properties (e.g., polarization phenomenon) caused by the operation state (e.g., cycle state) immediately before the particular time point do not completely disappear and affects the operation state (e.g., calendar state) immediately after the particular time point.

However, the degree-of-aging estimation model shown in FIG. 1 does not consider the situation in which the operation state of the secondary battery sharply changes, an estimation error of the degree of aging may be so large that it cannot be neglected, and as a result, it is the obstacle to accurately estimate the capacity retention rate or the remaining life of the secondary battery.

DISCLOSURE

Technical Problem

The present disclosure is designed to solve the above-described problem, and therefore the present disclosure is directed to providing an apparatus and method for estimating a capacity retention rate of a secondary battery in comprehensive consideration of the degree of cycle aging and the degree of calendar aging of the secondary battery.

These and other objects and advantages of the present disclosure will be understood by the following description and will be apparent from the embodiments of the present disclosure. Additionally, it will be readily understood that the objects and advantages of the present disclosure can be realized by the means set forth in the appended claims and combinations thereof.

Technical Solution

Various embodiments of the present disclosure for achieving the above-described object are as follows.

An apparatus for estimating a capacity retention rate according to an aspect of the present disclosure estimates a capacity retention rate of a secondary battery from a degree of calendar aging and a degree of cycle aging of the secondary battery included in a battery pack. The apparatus for estimating a capacity retention rate includes a control unit configured to receive current information and temperature information of the secondary battery from a sensing unit installed in the battery pack in each cycle having a preset time length, and perform a first main process and a second main process in a sequential order, and the apparatus further includes a memory configured to store a predetermined weighting factor, and further store a state of charge, a degree of cycle aging and a degree of calendar aging of the secondary battery updated in each cycle when the first main process is performed. The first main process includes a first subprocess for updating the state of charge stored in the memory based on the current information, a second subprocess for setting an operation state of the secondary battery to one of cycle state and calendar state based on the current information, and a third subprocess for updating the degree of cycle aging stored in the memory based on the updated state of charge, the current information and the temperature information when the operation state of the secondary battery is set to the cycle state by the second subprocess. The second main process includes estimating the capacity retention rate of the secondary battery based on the weighting factor, the updated degree of cycle aging and the degree of calendar aging stored in the memory.

The first subprocess may include integrating a current indicated by the current information over the time length, and updating the state of charge stored in the memory based on the integrated current and a maximum capacity stored in the memory.

The second subprocess may include setting the operation state of the secondary battery to the cycle state when a current rate corresponding to the current information is equal to or larger than a threshold current rate.

The memory may further be configured to store a plurality of cycle degree-of-aging profiles, and the third subprocess may include a first routine for selecting one cycle degree-of-aging profile matched to the updated state of charge, the current information and the temperature information among the plurality of cycle degree-of-aging profiles, a second routine for determining a first reference equivalent time point related to the selected cycle degree-of-aging profile, and a third routine for updating the degree of cycle aging stored in the memory using the selected cycle degree-of-aging profile based on the first reference equivalent time point.

The second subprocess may include setting the operation state of the secondary battery to the calendar state when a current rate corresponding to the current information is smaller than a threshold current rate.

The first main process may further include a fourth subprocess for updating the degree of calendar aging stored in the memory based on the updated state of charge and the temperature information when the operation state of the secondary battery is set to the calendar state by the second subprocess.

The memory may further be configured to store a plurality of calendar degree-of-aging profiles, and the fourth subprocess may include a fourth routine for selecting one calendar degree-of-aging profile matched to the updated state of charge and the temperature information from the plurality of calendar degree-of-aging profiles, a fifth routine for determining a second reference equivalent time point related to the selected calendar degree-of-aging profile, and a sixth routine for updating the degree of calendar aging stored in the memory using the selected cycle degree-of-aging profile based on the second reference equivalent time point.

The second main process may include a seventh routine for correcting the degree of cycle aging based on the weighting factor, and an eighth routine for estimating the capacity retention rate of the secondary battery based on the degree of calendar aging and the corrected degree of cycle aging.

The weighting factor may be a constant within a range between 0 and 2, determined through experimentation.

A battery pack according to another aspect of the present disclosure includes the apparatus for estimating a capacity retention rate.

A method for estimating a capacity retention rate according to still another aspect of the present disclosure includes receiving current information and temperature information of the secondary battery from a sensing unit installed in the battery pack in each cycle having a preset time length, activating a first main process, and activating a second main process. The first main process includes a first subprocess for updating a state of charge of the secondary battery based on the current information, a second subprocess for setting an operation state of the secondary battery to one of cycle state and calendar state based on the current information, a third subprocess for updating a degree of cycle aging based on the updated state of charge, the current information and the temperature information when the operation state of the secondary battery is set to the cycle state by the second subprocess, and a fourth subprocess for updating a degree of calendar aging based on the updated state of charge and the temperature information when the operation state of the secondary battery is set to the calendar state by the second subprocess. The second main process includes estimating the capacity retention rate of the secondary battery based on a predetermined weighting factor, the updated degree of cycle aging and the degree of calendar aging.

Advantageous Effects

According to at least one of the embodiments of the present disclosure, the degree of cycle aging and the degree of calendar aging of a secondary battery are calculated independently of each other, and the capacity retention rate of the secondary battery is estimated by combining the calculated degree of cycle aging and the calculated degree of calendar aging, thereby reducing a difference between the actual capacity retention rate and the estimated capacity retention rate.

Additionally, according to at least one of the embodiments of the present disclosure, the degree of cycle aging updated in each predetermined cycle is corrected based on the weighting factor, and the corrected degree of cycle aging is used to estimate the capacity retention rate, thereby improving the estimation accuracy of the capacity retention rate.

The effects of the present disclosure are not limited to the above-mentioned effects, and other effects not mentioned herein will be clearly understood by those skilled in the art from the appended claims.

DESCRIPTION OF DRAWINGS

The accompanying drawings illustrate a preferred embodiment of the present disclosure, and together with the following detailed description, serve to provide a further understanding of the technical features of the present disclosure, and thus the present disclosure is not construed as being limited to the drawings.

BEST MODE

Hereinafter, the preferred embodiments of the present disclosure will be described in detail with reference to the accompanying drawings. Prior to the description, it should be understood that the terms or words used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could be made thereto at the time of filing the application.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Unless the context clearly indicates otherwise, it will be understood that the term "comprises" or "includes" when used in this specification, specifies the presence of stated elements, but does not preclude the presence or addition of one or more other elements. Additionally, the term <control unit> as used herein refers to a processing unit of at least one function or operation, and this may be implemented by hardware or software alone or in combination.

In addition, throughout the specification, it will be further understood that when an element is referred to as being "connected to" another element, it can be directly connected to the other element or intervening elements may be present.

In the present disclosure, "degree of cycle aging" refers to a numerical value indicating the degree of aging accumulated in the secondary battery while the secondary battery is in cycle state in which charging/discharging is performed.

In the present disclosure, "degree of calendar aging" refers to a numerical value indicating the degree of aging accumulated in the secondary battery while the secondary battery is in calendar state in which charging/discharging is not performed.

In the present disclosure, "capacity retention rate (CCR)" is a value indicating a ratio of the maximum capacity of the secondary battery to the design capacity of the secondary battery. The capacity retention rate reduces with the increasing degree of cycle aging and/or the increasing degree of calendar aging.

Figure 2:
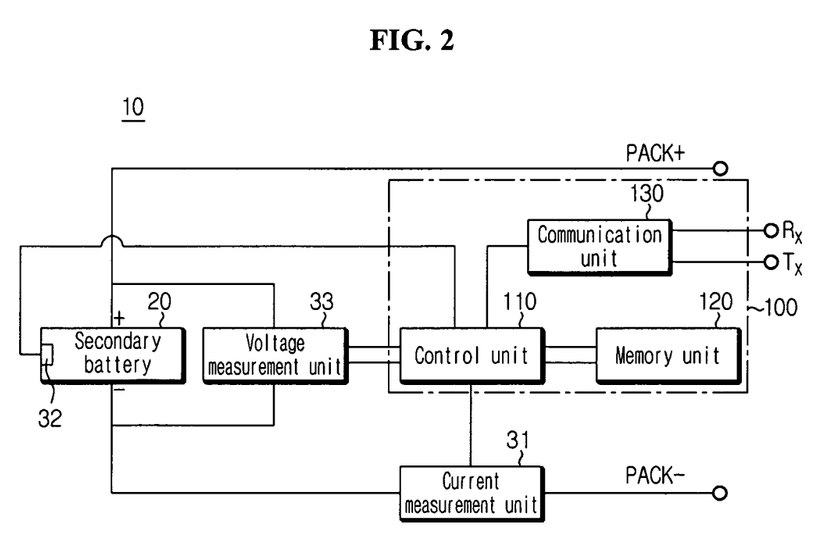
FIG. 2 is a schematic block diagram showing configuration of a battery pack according to an embodiment of the present disclosure and an apparatus for estimating a capacity retention rate included in the battery pack.

FIG. 2 is a schematic block diagram showing configuration of a battery pack 10 according to an embodiment of the present disclosure and an apparatus 100 for estimating a capacity retention rate included in the battery pack 10.

Referring to FIG. 2, the battery pack 10 includes at least one secondary battery 20, a sensing unit and the apparatus 100 for estimating the capacity retention rate. The apparatus 100 includes a control unit 110 and a memory 120, and optionally, may further include a communication unit 130.

The secondary battery 20, of which the degree of aging is to be estimated using the apparatus 100, includes one or two or more battery cells. Here, the battery cell refers to an element that can store and extract electrical energy, i.e., a minimum unit capable of charging and discharging repeatedly. For example, the battery cell may be a pouch-type lithium ion battery.

When a plurality of battery cells is included in the secondary battery 20, the plurality of battery cells may be electrically connected to each other in series and/or in parallel.

The secondary battery 20 may be electrically connected to various load devices through an external terminal provided in the battery pack 10. For example, the load device may be a vehicle such as an electric vehicle, a flying object such as a drone, a large-capacity energy storage device (ESS) included in an electrical grid, or a mobile device.

The external terminal provided in the battery pack 10 may be electrically connected to a charging device. The charging device may be electrically connected to the secondary battery 20 by control of the load device supplied with power from the secondary battery 20.

The sensing unit includes a current measurement circuit 31 and a temperature measurement circuit 32, and optionally, further includes a voltage measurement circuit 33.

The current measurement circuit 31 includes a current sensor commonly used in the field of batteries. For example, the current measurement circuit 31 may output current information representing the direction and magnitude of an electric current flowing through the secondary battery 20. The current information outputted by the current measurement circuit 31 may be received by the apparatus 100.

The temperature measurement circuit 32 includes a temperature sensor commonly used in the field of batteries. For example, the temperature measurement circuit 32 may be directly attached to the secondary battery 20 or installed close to the secondary battery 20 to output temperature information representing the temperature of the secondary battery 20. The temperature information outputted by the temperature measurement circuit 32 may be received by the apparatus 100.

The voltage measurement circuit 33 includes a voltage sensor commonly used in the field of batteries. For example, the voltage measurement circuit 33 may output voltage information representing a potential difference between a positive electrode terminal and a negative electrode terminal of the secondary battery 20. The voltage information outputted by the voltage measurement circuit 33 may be received by the apparatus 100.

The current measurement circuit 31, the temperature measurement circuit 32 and/or the voltage measurement circuit 33 may measure the current, temperature and voltage of the secondary battery 20 in each predetermined cycle, and transmit the measured current information, temperature information and/or voltage information to the control unit 110. The measurement results may be provided to the control unit 110 in the form of an analog signal or a digital signal. When the current information, the temperature information and/or the voltage information is in the form of an analog signal, the control unit 110 may convert the current information, the temperature information and/or the voltage information to a digital signal through A/D (Analog to Digital) signal conversion processing, and determine the present current, temperature and voltage of the secondary battery 20 based on the converted digital signal.

The apparatus 100 is an apparatus that can individually estimate the degree of cycle aging and the degree of calendar aging of the secondary battery 20, and may be operably connected to the sensing unit through wired means such as a cable or wireless means such as Bluetooth.

The memory 120 stores various types of data and programs used for the control unit 110 to estimate the degree of cycle aging, the degree of calendar aging and/or the capacity retention rate of the secondary battery 20.

Additionally, while the control unit 110 is estimating the degree of cycle aging, the degree of calendar aging and/or the capacity retention rate (CCR) of the secondary battery 20, the memory 120 deletes and/or updates various types of data stored in the memory 120 and additionally stores new data as per the request from the control unit 110. Additionally, the memory 120 stores initial values of various parameters used to periodically estimate the degree of cycle aging, the degree of calendar aging and/or the capacity retention rate of the secondary battery 20. For example, the memory 120 may store the initial value of the state of charge, the initial value of the degree of cycle aging, the initial value of the degree of calendar aging, the initial value of the capacity retention rate, the initial value of the reference equivalent time point, a threshold current rate, an weighting factor, a plurality of cycle degree-of-aging profiles and/or a plurality of calendar degree-of-aging profiles of the secondary battery 20.

The memory 120 may store a lookup table defining an OCV-SOC curve representing the relationship between Open Circuit Voltage (OCV) and State Of Charge (SOC) of the secondary battery 20. The control unit 110 may obtain the SOC from the OCV or the OCV from the SOC by referring to the lookup table.

The memory 120 is not limited to a particular type and includes any known information storage means that can record, delete, update and read data. For example, the memory 120 may be DRAM, SDRAM, the flash memory 120, ROM, EEPROM, and register. The memory 120 may store program codes defining the processes that can be performed by the control unit 110.

Meanwhile, the memory 120 may be physically separated from the control unit 110, or may be integrated into a chip together with the control unit 110.

The apparatus 100 may further include the communication unit 130. In this case, the control unit 110 may be operably connected to the communication unit 130 through known wired means or wireless means. The apparatus 100 may output notification information representing the degree of cycle aging, the degree of calendar aging and/or the capacity retention rate of the secondary battery 20 to an external device (e.g., the user's PC) through the communication unit 130.

The notification information outputted from the communication unit 130 may be received by a control computer of the load device mounted in the secondary battery 20 or a diagnosis device of the secondary battery 20. The control computer or the diagnosis device may determine whether to replace the secondary battery 20 based on the notification information received from the apparatus 100. Additionally, the control computer or the diagnosis device may convert and output the notification information into the visual form (e.g., image) or audible form (e.g., audio) that can be recognized by humans. Additionally, the control computer or the diagnosis device may output a warning message when the degree of cycle aging, the degree of calendar aging and/or the capacity retention rate included in the notification information exceeds the threshold.

As described above, the control unit 110 estimates the degree of cycle aging, the degree of calendar aging and/or the capacity retention rate of the secondary battery 20. The control unit 110 may selectively include a processor, an application-specific integrated circuit (ASIC), a chipset, a logic circuit, a register, a communication modem and a data processing device known in the art to execute the above-described control logics. Additionally, when the control logics are implemented in software, the control unit 110 may be implemented as a set of program modules. In this instance, each program module may be stored in the memory 120 and executed by the computer processor. The memory 120 may be inside or outside of the processor, and may be connected to the processor with a variety of known computer components. Additionally, the memory 120 may be included in the memory 120 of the present disclosure. Additionally, the memory 120 refers collectively to devices in which information is stored irrespective of the device type and is not limited to the particular memory 120 device.

At least one of the various control logics of the control unit 110 may be combined, and the combined control logics may be written in computer-readable code system and recorded in computer-readable recording media. The recording media is not limited to a particular type and includes any type that can be accessed by the processor included in the computer. For example, the recording media includes at least one selected from the group consisting of ROM, RAM, a register, CD-ROM, a magnetic tape, a hard disk, a floppy disk and an optical data recording device. Additionally, the code system may be modulated to a carrier signal and included in a communication carrier at a particular time point, and may be stored and executed in computers connected via a network in distributed manner. Additionally, functional programs, codes and code segments for implementing the combined control logics may be readily inferred by programmers in the technical field to which the present disclosure belongs.

The control unit 110 may be a Battery Management System (BMS) that can be electrically connected to the secondary battery 20, or a control element include in the BMS.

For convenience of description, hereinafter, the degree of cycle aging is also referred to as "$DOA_{cyc}$", and the degree of calendar aging is also referred to as "$DOA_{cal}$". In this definition, DOA is a shorted form of "Degree Of Aging".

Figure 3:
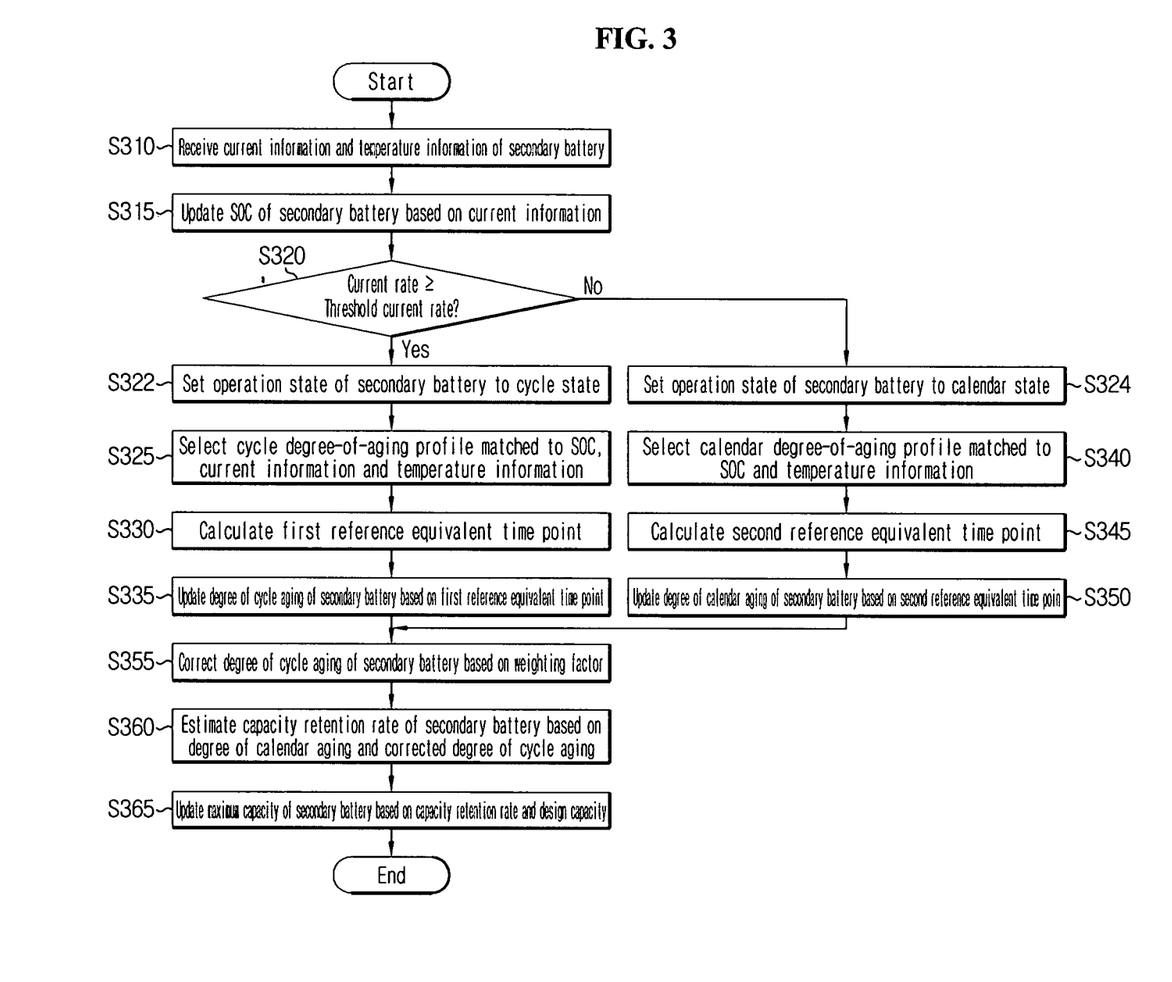
FIG. 3 is a flowchart showing a method for estimating the degree of cycle aging, the degree of calendar aging and the capacity retention rate of a secondary battery according to an embodiment of the present disclosure.
Figure 4:
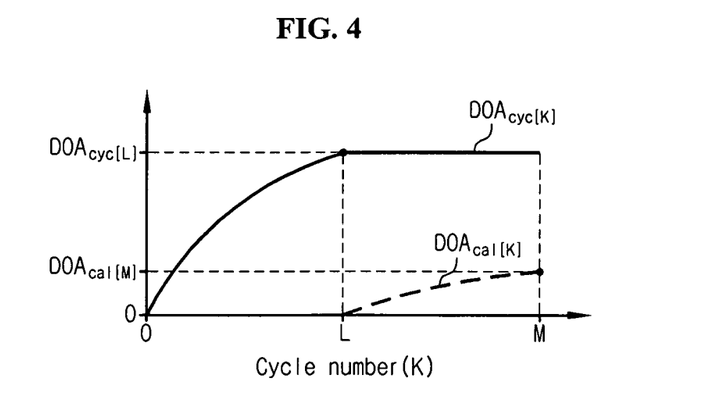
FIG. 4 is a graph showing the relationship between the degree of cycle aging and the degree of calendar aging estimated respectively according to an embodiment of the present disclosure.

FIG. 3 is a flowchart showing a method for estimating the degree of cycle aging, the degree of calendar aging and the capacity retention rate of the secondary battery 20 according to an embodiment of the present disclosure, and FIG. 4 is a graph showing the relationship between the degree of cycle aging and the degree of calendar aging estimated respectively according to an embodiment of the present disclosure. The steps of FIG. 3 may be iteratively performed in each predetermined cycle. Each cycle has a preset time length $\Delta t$.

Referring to FIG. 3, in S310, the control unit 110 receives current information and temperature information of the secondary battery 20 from the sensing unit in $k^{th}$ (k=1, 2, 3, . . . ) cycle. k is a counting number indicating the present cycle, and increases by 1 every time $\Delta t$ elapsed.

That is, the control unit 110 receives current information and temperature information representing the current $I_k$ and the temperature $T_k$ of the present $k^{th}$ cycle. Optionally, the control unit 110 may further receive voltage information of the secondary battery 20 from the sensing unit.

When S310 is finished, the control unit 110 activates a first main process. The first main process is activated by the control unit 110 based on the current information and the temperature information received in S305. The first main process includes a plurality of subprocesses. Specifically, the first main process basically includes first to third subprocesses.

After one of the first subprocess and the second subprocess is finished, the other may be performed, or while one is being performed, the other may be performed, or both may be simultaneously performed.

S315, S320, S322, S324, S325 S330, S335, S340, S345 and S350 of FIG. 3 are steps that may be performed in the first main process when the first main process is activated.

In S315, the control unit 110 performs the first subprocess. When performing the first subprocess, the control unit 110 updates a $SOC_{k-1}$ stored in the memory 120 based on the current information. Specifically, the control unit 110 integrates the current $I_k$ determined from the current information during $\Delta t$. Subsequently, the control unit 110 updates the $SOC_{k-1}$ to a $SOC_k$ based on the integrated current amount $I_k \times \Delta t$, the previous SOC $SOC_{k-1}$, and the maximum capacity $Q_{max}$. For example, $SOC_k = SOC_{k-1} + (I_k \times \Delta t)/Q_{max}$. When k=1, a $SOC_0$ is the initial value of SOC stored in the memory 120.

When the secondary battery 20 is being charged in the present cycle, the integral current $I_k \times \Delta t$ has a positive value, and thus the $SOC_k$ after updating is larger than the $SOC_{k-1}$ before updating. On the contrary, when the secondary battery 20 is being discharged in the present cycle, the integral current $I_k \times \Delta t$ has a negative value, and thus the $SOC_k$ after updating is smaller than the $SOC_{k-1}$ before updating.

The control unit 110 performs the second subprocess. When performing the second subprocess, the control unit 110 sets the operation state of the secondary battery 20 to one of a cycle state and a calendar state based on the current information.

Specifically, the second subprocess includes S320, S322 and S324. In S320, the control unit 110 determines if the current rate corresponding to the current information is equal to or larger than the threshold current rate.

When the current rate corresponding to the current information is equal to or larger than the threshold current rate, the control unit 110 sets the operation state of the secondary battery 20 to the cycle state in S322. The current rate that is equal to or larger than the threshold current rate indicates that the secondary battery 20 is now being charged and discharged. Here, the current rate refers to a value obtained by dividing the charge/discharge current corresponding to the current information by the design capacity of the secondary battery 20 without indicating the unit. The current rate is also referred to as "C-rate", and its unit may be 'C'. For example, when the charge/discharge current is 1 A (ampere) and the design capacity is 4 (Ah: ampere hour), the current rate is 0.25 C. In contrast, when the current rate corresponding to the current information is smaller than the threshold current rate, the control unit 110 sets the operation state of the secondary battery 20 to the calendar state in S324. The current rate that is smaller than the threshold current rate indicates that the secondary battery 20 is not charged/discharged and is left in no-load state now.

When the first and the second subprocesses are finished, the control unit 110 may perform the third subprocess. When the operation state of the secondary battery 20 is set to the cycle state in the second subprocess, the third subprocess may be performed by the control unit 110.

When performing the third subprocess, the control unit 110 updates the degree of cycle aging stored in the memory 120 based on the current information, the temperature information and the updated SOC in the first subprocess, $SOC_k$. When the third subprocess is initially performed (i.e., k=1), the control unit 110 updates the initial value of the degree of cycle aging, $DOA_{cal}[0]$, stored in the memory 120 to a larger value. $DOA_{cal}[0]=0$.

Specifically, the third subprocess includes first to third routines.

In S325, the control unit 110 performs the first routine. When performing the first routine, the control unit 110 selects one cycle degree-of-aging profile matched to the updated SOC $SOC_k$, the current information and the temperature information from the plurality of cycle degree-of-aging profiles.

In an embodiment, the cycle degree-of-aging profile selected in the $k^{th}$ cycle may be represented by the function such as the following Equation 1:

$$DOA_{cyc\_k}(t) = 1 - e^{-\beta_k t^{\gamma_k}} \qquad \text{<Equation 1>}$$

In Equation 1, each of the parameters $\beta_k$ and $\gamma_k$ is the factor that determines a shape of the presently selected cycle degree-of-aging profile, and may be a positive number. The cycle degree-of-aging profile represented by Equation 1 has the shape gradually converging to 1 over time like the conventional degree-of-aging profile shown in FIG. 1. The rate at which the cycle degree-of-aging profile converges to 1 depends on the parameters $\beta_k$ and $\gamma_k$.

In the first routine, selecting one of the plurality of cycle degree-of-aging profiles represents uniquely selecting each value of the parameters $\beta_k$ and $\gamma_k$ of Equation 1. The relationship between the parameter $\beta_k$, and the SOC, the temperature and the current rate of the secondary battery 20 may be predefined in the form of a lookup table or a function through experimentation. Likewise, the relationship between the parameter $\gamma_k$, and the SOC, the temperature and the current rate of the secondary battery 20 may be predefined in the form of a lookup table or a function through experimentation.

In S330, the control unit 110 performs the second routine. When performing the second routine, the control unit 110 calculates a first reference equivalent time point $t_k$. The first reference equivalent time point $t_k$ is the start time of estimation of the degree of cycle aging on the degree-of-aging profile $DOA_{cyc\_k}$ selected in the $k^{th}$ cycle. In an embodiment, the control unit 110 may calculate the first reference equivalent time point $t_k$ using the following Equation 2:

$$t_k = \left\{ \frac{\beta_{k-1}(t_{k-1} + \Delta t)^{\gamma_{k-1}}}{\beta_k} \right\}^{\frac{1}{\gamma_k}} \qquad \text{<Equation 2>}$$

In Equation 2, $t_{k-1}$ is the previous first reference equivalent time point used in the previous $k-1^{th}$ cycle. When the second routine is initially performed (i.e., k=1), the control unit 110 substitutes the initial value of the first reference equivalent time point, 0, into $t_{k-1}$ of Equation 2. That is, $t_0=0$ is stored in the memory 120.

In S335, the control unit 110 performs the third routine. When performing the third routine, the control unit 110 update the degree of cycle aging $DOA_{cyc}[k-1]$ calculated in the previous $k-1^{th}$ cycle and stored the updated $DOA_{cyc}[k-1]$ in the memory 120, using the cycle degree-of-aging profile $DOA_{cyc\_k}(t)$ selected in the first routine, based on $t_k$ and/or $\Delta t$. When k=1, the control unit 110 updates the initial value $DOA_{cyc}[0]$ of the degree of cycle aging stored as 0 in the memory 120, to a value greater than 0.

In an embodiment, the control unit 110 may update the degree of cycle aging using the following Equation 3:

$$DOA_{cyc}[K] = 1 - e^{-\beta_k(t_k + \Delta t)^{\gamma_k}} \qquad \text{<Equation 3>}$$

In Equation 3, $DOA_{cyc}[k]$ is the degree of cycle aging accumulated until the $k^{th}$ cycle, and is a value that replaces the degree of cycle aging $DOA_{cyc}[k-1]$ accumulated until the $k-1^{th}$ cycle and stored in the memory 120. That is, $DOA_{cyc}[k-1]$ is updated to $DOA_{cyc}[k]$.

When a difference between $DOA_{cyc}[k-1]$ and $DOA_{cyc}[k]$ is larger than a first difference threshold or $DOA_{cyc}[k]$ is smaller than $DOA_{cyc}[k-1]$, the control unit 110 may output a first error signal to the communication unit 130.

The first main process may further include a fourth subprocess. When the operation state of the secondary battery 20 is set to calendar state in the second subprocess, the fourth subprocess rather than the third subprocess is performed by the control unit 110.

When performing the fourth subprocess, the control unit 110 updates the degree of calendar aging stored in the memory 120 based on the temperature information and the SOC updated in the first subprocess. When the fourth subprocess is initially performed, the control unit 110 updates the initial value $DOA_{cal}[0]$ of the degree of calendar aging stored as 0 in the memory 120 to a value greater than 0.

Specifically, the fourth subprocess includes fourth to sixth routines.

In S340, the control unit 110 performs the fourth routine. When performing the fourth routine, the control unit 110 selects one calendar degree-of-aging profile matched to the updated SOC $SOC_k$ and the temperature information from the plurality of calendar degree-of-aging profiles. The degree of calendar aging is related to aging while the secondary battery 20 is not charged/discharged, and thus does not consider the current information as opposed to the degree of cycle aging.

In an embodiment, the calendar degree-of-aging profile $DOA_{cal\_k}(t)$ selected in the $k^{th}$ cycle may be represented by the function such as the following Equation 4:

$$DOA_{cal\_k}(t) = 1 - e^{-\beta^*_k t^{\gamma^*_k}} \qquad \text{<Equation 4>}$$

In Equation 4, each of the parameters $\beta^*_k$ and $\gamma^*_k$ is the factor that determines the shape of the presently selected calendar degree-of-aging profile, and may be a positive number. The calendar degree-of-aging profile represented by Equation 4 has the shape gradually converging to 1 over time as shown in FIG. 1. The rate at which the calendar degree-of-aging profile converges to 1 depends on the parameters $\beta^*_k$ and $\gamma^*_k$.

In the fourth routine, selecting one of the plurality of calendar degree-of-aging profiles represents uniquely selecting each value of the parameters $p^*_k$ and $\gamma^*_k$ of Equation 4. The relationship between the parameter $\beta^*_k$, and the SOC and temperature of the secondary battery 20 may be predefined in the form of a lookup table or a function through experimentation. Likewise, the relationship between the parameter $\gamma_k$, and the SOC and temperature of the secondary battery 20 may be predefined in the form of a lookup table or a function through experimentation.

In S345, the control unit 110 performs the fifth routine. When performing the fifth routine, the control unit 110 calculates a second reference equivalent time point $t^*_k$. The second reference equivalent time point $t^*_k$ is the start time of estimation of the degree of calendar aging on the calendar degree-of-aging profile $DOA_{cal\_k}$ selected in the $k^{th}$ cycle. In an embodiment, the control unit 110 may calculate the second reference equivalent time point $t^*_k$ using the following Equation 5:

$$t^*_k = \left\{ \frac{\beta^*_{k-1}(t^*_{k-1} + \Delta t)^{\gamma^*_{k-1}}}{\beta^*_k} \right\}^{\frac{1}{\gamma^*_k}} \qquad \text{<Equation 5>}$$

In Equation 5, $t^*_{k-1}$ is the previous second reference equivalent time point used in the previous $k-1^{th}$ cycle. When the fifth routine is initially performed (i.e., k=1), the control unit 110 substitutes the initial value of the second reference equivalent time point, 0, into $t^*_{k-1}$ of Equation 5. That is, $t^*_0=0$ is stored in the memory 120.

In S350, the control unit 110 performs the sixth routine. When performing the sixth routine, the control unit 110 updates the degree of calendar aging $DOA_{cal}[k-1]$ calculated in the previous $k-1^{th}$ cycle and stored in the memory 120, using the calendar degree-of-aging profile $DOA_{cal\_k}(t)$ selected in the fourth routine, based on $t^*_k$ and/or $\Delta t$. In an embodiment, the control unit 110 may update the degree of calendar aging using the following Equation 6.

In an embodiment, the control unit 110 may update the degree of cycle aging using the following Equation 6:

$$DOA_{cal}[K] = 1 - e^{-\beta^*_k (t^*_k + \Delta t)^{\gamma^*_k}} \qquad \text{<Equation 6>}$$

In Equation 6, $DOA_{cal}[k]$ is the degree of calendar aging accumulated until the $k^{th}$ cycle, and is a value that replaces the degree of calendar aging $DOA_{cal}[k-1]$ accumulated until the $k-1^{th}$ cycle and stored in the memory 120. That is, $DOA_{cal}[k-1]$ is updated to $DOA_{cal}[k]$.

When a difference between $DOA_{cal}[k-1]$ and $DOA_{cal}[k]$ is larger than a second difference threshold or $DOA_{cal}[k]$ is smaller than $DOA_{cal}[k-1]$, the control unit 110 may output a second error signal to the communication unit 130.

Meanwhile, in each cycle, the third subprocess and the fourth subprocess is alternatively performed. For example, in the $k^{th}$ cycle, when the third subprocess is performed, the fourth subprocess is inactivated, and on the contrary, when the fourth subprocess is performed, the third subprocess is inactivated.

In the $k^{th}$ cycle, when the third subprocess is performed, the control unit 110 maintains the degree of calendar aging of the $k^{th}$ cycle at the previous value. That is, in the $k^{th}$ cycle, when the third subprocess is performed, the control unit 110 may set $DOA_{cal}[k]$ to be equal to $DOA_{cal}[k-1]$. For example, referring to FIG. 4, when the operation state of the secondary battery 20 is set to cycle state from the first to the $L^{th}$ cycle, the degree of cycle aging of the secondary battery 20 gradually increases from 0 to $DOA_{cyc}[L]$, while the degree of calendar aging is maintained at the initial value $DOA_{cal}[0]=0$ until the $L^{th}$ cycle.

On the contrary, in the $k^{th}$ cycle, when the fourth subprocess is performed, the control unit 110 maintains the degree of cycle aging of the $k^{th}$ cycle at the previous value. That is, in the $k^{th}$ cycle, when the fourth subprocess is performed, the control unit 110 may set $DOA_{cyc}[k]$ to be equal to $DOA_{cyc}[k-1]$. For example, referring to FIG. 4, when the operation state of the secondary battery 20 is set to calendar state until the $M^{th}$ cycle after the $L^{th}$ cycle, the degree of calendar aging of the secondary battery 20 gradually increases from 0 to $DOA_{cal}[M]$, while the degree of cycle aging is maintained at $DOA_{cyc}[L]$ until the $M^{th}$ cycle after the $L^{th}$ cycle.

When the steps included in the first main process are all finished, the control unit 110 may activate a second main process. The second main process includes a plurality of routines. S355, S360 and S365 of FIG. 3 are steps that may be performed when the second main process is activated.

Specifically, the second main process basically includes a seventh routine and an eighth routine, and optionally, may further include a ninth routine.

In S355, the control unit 110 performs the seventh routine. When performing the seventh routine, the control unit 110 corrects the degree of cycle aging $DOA_{cyc}[k]$ obtained in the third routine, based on the weighting factor stored in the memory 120. In an embodiment, the control unit 110 may correct the degree of cycle aging using the following Equation 7:

$$DOA_{cyc\_correct}[K] = DOA_{cyc}[K] \times w \qquad \text{<Equation 7>}$$

In Equation 7, w is a value representing the weighting factor stored in the memory 120. w may be a constant within a predetermined range (e.g., equal to or greater than 0 and equal to or less than 2), and may be predetermined by the previous experiment or the control unit 110. Additionally, $DOA_{cyc\_correct}[k]$ is a value representing the corrected degree of cycle aging.

In S360, the control unit 110 performs the eighth routine. When performing the eighth routine, the control unit 110 estimates the capacity retention rate $CRR_{mix}[k]$ of the secondary battery 20 based on the degree of calendar aging (see Equation 6) and the corrected degree of cycle aging (see Equation 7). In an embodiment, the control unit 110 may calculate $CRR_{mix}[k]$ representing the maximum amount of charge that can be charged in the secondary battery 20 in the $k^{th}$ cycle using the following Equation 8.

$$CRR_{mix}[K] = \{1 - DOA_{cyc\_correct}[K]\} \times (1 - DOA_{cal}[K]) \qquad \text{<Equation 8>}$$

It is obvious to those skilled in the art that as the secondary battery 20 ages, the capacity retention rate reduces. For example, referring to Equation 8, as the duration of cycle state of the secondary battery 20 and the duration of calendar state of the secondary battery 20 increase over time, each of $DOA_{cyc\_correct}[k]$ and $DOA_{cal}[k]$ increases. Accordingly, as k increases, $CRR_{mix}[k]$ reduces from 1 toward 0.

In S365, the control unit 110 performs the ninth routine. When performing the ninth routine, the control unit 110 may update the maximum capacity $Q_{max}$ of the secondary battery 20 based on $CRR_{mix}[k]$ and the design capacity $Q_{design}$. For example, $Q_{max} = Q_{design} \times CRR_{mix}[k]$. $CRR_{mix}[k]$ is a positive number that is smaller than 1, and thus $Q_{max}$ is smaller than $Q_{design}$. The updated maximum capacity $Q_{max}$ may be used to update the SOC in S315 that will be performed in the next cycle.

Figure 5:
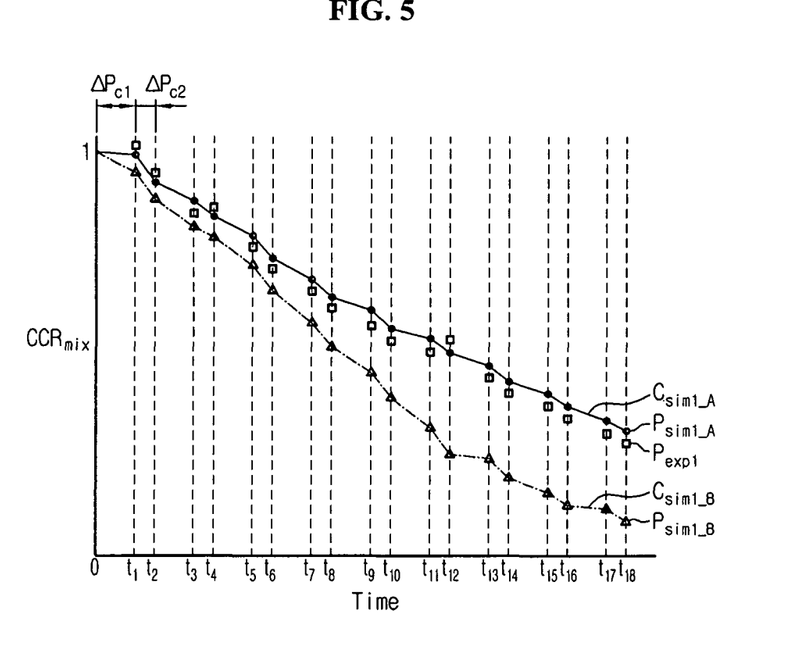
FIGS. 5 and 6 are graphs for reference in describing a method for determining a weighting factor used to correct the degree of cycle aging according to an embodiment of the present disclosure.
Figure 6:
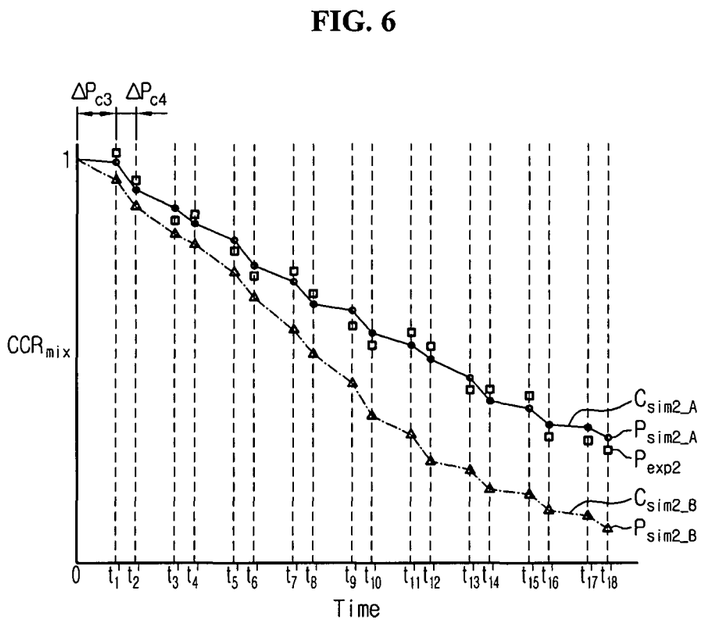

FIGS. 5 and 6 are graphs for reference in describing a method for determining the weighting factor used to correct the degree of cycle aging according to an embodiment of the present disclosure.

The control unit 110 performs at least one preset induced aging test of test batteries. Each test battery is manufactured with the same specification as the secondary battery 20, and before performing each induced aging test, the capacity retention rate is 1.

When each induced aging test is performed, instead of the secondary battery 20, each test battery may be electrically connected to the battery pack 10 of FIG. 2 one by one. Additionally, when one induced aging test ends, after the used test battery is replaced with a new one, the other induced aging test may be performed.

The actual capacity retention rate is calculated at a plurality of different points in time between the start time and the end time of each induced aging test.

Along with this, the control unit 110 estimates the capacity retention rate of each test battery at the plurality of points in time from the start time to the end time of each induced aging test. In this instance, the control unit 110 may substitute two or more different preset candidate values into w of Equation 7, to obtain a plurality of capacity retention rate change curves. The plurality of capacity retention rate change curves and the plurality of candidate values have one-to-one correspondence. That is, each capacity retention rate change curve is defined by the capacity retention rates estimated at the plurality of points in time when each of the candidate values is substituted into w of Equation 7.

The control unit 110 compares the plurality of capacity retention rate change curves with the actual capacity retention rates calculated at the plurality of points in time. Subsequently, the control unit 110 determines one candidate value related to one capacity retention rate change curve having the smallest difference from the actual capacity retention rates among the capacity retention rate change curves as the weighting factor.

FIG. 5 is a graph showing the results of a first induced aging test performed on a first test battery and a second test battery having the same specification as the secondary battery 20 and the capacity retention rate of 1, and FIG. 6 is a graph showing the results of a second induced aging test performed on a third test battery and a fourth test battery having the same specification as the secondary battery 20 and the capacity retention rate of 1. From each of the first and second induced aging tests, two capacity retention rate change curves was obtained by substituting different first and second candidate values into w of Equation 7.

Referring to FIG. 5, the first induced aging test is a test in which each of a first test duration $\Delta P_{C1}$ and a second test duration $\Delta P_{C2}$ repeats nine times in an alternating manner. The first test duration $\Delta P_{C1}$ is the period of time during which the calendar state is maintained for four weeks with the SOC and temperature of each of the first and second test batteries being 60% and 30° C. respectively. The second test duration $\Delta P_{C2}$ is the period of time during which the cycle state is maintained for two weeks with each of the first and second test batteries whose temperature is 45° C. being charged at 9 C (C-rate) and discharged at 6 C in SOC of 30%~60%.

In FIG. 5, the first induced aging test is performed on the first test battery to obtain the estimated capacity retention rates $P_{sim1\_A}$ and the estimated capacity retention rates $P_{sim1\_B}$, and the first induced aging test is performed on the second test battery to obtain the actual capacity retention rates $P_{exp1}$.

In the first induced aging test seen through the graph shown in FIG. 5, the first capacity retention rate change curve $C_{sim1\_A}$ was obtain by substituting the first candidate value into w of Equation 7, and the second capacity retention rate change curve $C_{sim1\_B}$ was obtained by substituting the second candidate value that is different from the first candidate value into w of Equation 7.

The first capacity retention rate change curve $C_{sim1\_A}$ is a curve defined by the capacity retention rates $P_{sim1\_A}$ estimated at a plurality of points in time $t_1 \sim t_{18}$ in which a change is made from one of the first test duration $\Delta P_{C1}$ and the second test duration $\Delta P_{C2}$ to the other. Additionally, the second capacity retention rate change curve $C_{sim1\_B}$ is a curve defined by the capacity retention rates $P_{sim1\_B}$ estimated at the plurality of points in time $t_1 \sim t_{18}$ in which a change is made from one of the first test duration $\Delta P_{C1}$ and the second test duration $\Delta P_{C2}$ to the other. Additionally, the actual capacity retention rates $P_{exp1}$ are calculated at the plurality of time points $t_1 \sim t_{18}$. Accordingly, the estimated capacity retention rates $P_{sim1\_A}$ may correspond to the estimated capacity retention rates $P_{sim1\_B}$ and the actual capacity retention rates $\beta_{exp1}$ one-to-one on the basis of the plurality of points in time $t_1 \sim t_{18}$.

The control unit 110 compares the estimated capacity retention rates $P_{sim1\_A}$ defining the first capacity retention rate change curve $C_{sim1\_A}$ with the actual capacity retention rates $P_{exp1}$, and the estimated capacity retention rates $P_{sim1\_B}$ defining the second capacity retention rate change curve $C_{sim1\_B}$ with the actual capacity retention rates $P_{exp1}$.

For example, the control unit 110 may set a sum of differences (or a sum of squared deviations) between the estimated capacity retention rates $P_{sim1\_A}$ and a actual capacity retention rates $P_{exp1}$ as a first result value, and a sum of differences (or the sum of squared deviations) between the estimated capacity retention rates $P_{sim1\_B}$ and the actual capacity retention rates $P_{exp1}$ as a second result value.

Referring to FIG. 6, the second induced aging test is a test in which each of a third test duration $\Delta P_{C3}$ and a fourth test duration $\Delta P_{C4}$ repeats nine times in an alternating manner. The third test duration $\Delta P_{C3}$ is the period of time during which the calendar state is maintained for four weeks with the SOC and temperature of each of the third and fourth test batteries being 50% and 45° C. respectively. The fourth test duration $\Delta P_{C4}$ is the period of time during which the cycle state is maintained for two weeks with each of the third and fourth test batteries whose temperature is 30'C being charged at 9 C (C-rate) and discharged at 6 C in SOC of 30%~60%.

In FIG. 6, the second induced aging test is performed on the third test battery to obtain the estimated capacity retention rates $P_{sim2\_A}$ and the estimated capacity retention rates $P_{sim2\_B}$, and the second induced aging test is performed on the fourth test battery to obtain the actual capacity retention rates $\beta_{exp2}$.

In the second induced aging test seen through the graph shown in FIG. 6, a third capacity retention rate change curve $C_{sim2\_A}$ was obtained by substituting the first candidate value into w of Equation 7, and a fourth capacity retention rate change curve $C_{sim2\_B}$ was obtained by substituting the second candidate value into w of Equation 7.

The third capacity retention rate change curve $C_{sim2\_A}$ is a curve defined by the capacity retention rates $P_{sim2\_A}$ estimated at a plurality of points in time $t'_1 \sim t'_{18}$ in which a change is made from one of the third test duration $\Delta P_{C3}$ and the fourth test duration $\Delta P_{C4}$ to the other. Additionally, the fourth capacity retention rate change curve $C_{sim2\_B}$ is a curve defined by the capacity retention rates $P_{sim2\_B}$ estimated at the plurality of points in time $t'_1 \sim t'_{18}$ in which a change is made from one of the third test duration $\Delta P_{C3}$ and the fourth test duration $\Delta P_{C4}$ to the other. Additionally, the actual capacity retention rates $P_{exp2}$ are calculated at the plurality of points in time $t'_1 \sim t'_{18}$. Accordingly, the estimated capacity retention rates $P_{sim2\_A}$ may correspond to the estimated capacity retention rates $P_{sim2\_B}$ and the actual capacity retention rates $P_{exp2}$ one-to-one on the basis of the plurality of points in time $t'_1 \sim t'_{18}$.

The control unit 110 compares the estimated capacity retention rates $P_{sim2\_A}$ defining the third capacity retention rate change curve $C_{sim2\_A}$ with the actual capacity retention rates $P_{exp2}$, and the estimated capacity retention rates $P_{sim2\_B}$ defining the forth capacity retention rate change curve $C_{sim2\_B}$ with the actual capacity retention rates $P_{exp2}$.

For example, the control unit 110 may set a sum of differences (or a sum of squared deviations) between the estimated capacity retention rates $P_{sim2\_A}$ and the actual capacity retention rates $P_{exp2}$ as a third result value, and a sum of differences (or a sum of squared deviations) between the estimated capacity retention rates $P_{sim2\_B}$ and the actual capacity retention rates $P_{exp2}$ as a fourth result value.

The control unit 110 may calculate the same number of comparison values as the candidate values. Each comparison value is the sum of all result values related to one of the candidate values. For example, referring to FIGS. 5 and 6, the control unit calculates a first comparison value related to the first candidate value, and a second comparison value related to the second candidate value. Here, the first comparison value is the sum of the first result value and the third result value, and the second comparison value is the sum of the second result value and the fourth result value.

The control unit 110 may set one candidate value related to the smallest comparison value among the calculated comparison values as the weighting factor, and store it in the memory 120. For example, when the first comparison value is smaller than the second comparison value, the control unit 110 may store the weighting factor in the memory 120 as the same value as the first candidate value. On the contrary, when the second comparison value is smaller than the first comparison value, the control unit 110 may store the weighting factor in the memory 120 as the same value as the second candidate value.

The embodiments of the present disclosure described hereinabove are not implemented only through the apparatus and method, and may be implemented through programs that realize the functions corresponding to the configurations of the embodiments of the present disclosure or recording media having the programs recorded thereon, and this implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

What is claimed is:

1. An apparatus for estimating a capacity retention rate of a secondary battery from a degree of calendar aging and a degree of cycle aging of the secondary battery included in a battery pack, the apparatus comprising:
    a control unit configured to receive current information and temperature information of the secondary battery from a sensing unit installed in the battery pack in each cycle having a preset time length, and perform a first main process and a second main process in a sequential order; and
    a memory configured to store a predetermined weighting factor, and further store a state of charge, a degree of cycle aging and a degree of calendar aging of the secondary battery updated in each cycle when the first main process is performed,
    wherein the first main process includes:
        a first subprocess for updating the state of charge stored in the memory based on the current information;
        a second subprocess for setting an operation state of the secondary battery to one of cycle state and calendar state based on the current information; and
        a third subprocess for updating the degree of cycle aging stored in the memory based on the updated state of charge, the current information and the temperature information when the operation state of the secondary battery is set to the cycle state by the second subprocess,
    wherein the second main process includes estimating the capacity retention rate of the secondary battery based on the predetermined weighting factor, the updated degree of cycle aging and the degree of calendar aging stored in the memory, and
    wherein the first subprocess includes integrating a current indicated by the current information over the preset time length, and updating the state of charge stored in the memory based on the integrated current and a maximum capacity stored in the memory.

2. The apparatus for estimating a capacity retention rate of a secondary battery according to claim 1, wherein the second subprocess includes setting the operation state of the secondary battery to the cycle state when a current rate corresponding to the current information is equal to or larger than a threshold current rate.

3. The apparatus for estimating a capacity retention rate of a secondary battery according to claim 1, wherein the second subprocess includes setting the operation state of the secondary battery to the calendar state when a current rate corresponding to the current information is smaller than a threshold current rate.

4. The apparatus for estimating a capacity retention rate of a secondary battery according to claim 1, wherein the first main process further includes:
    a fourth subprocess for updating the degree of calendar aging stored in the memory based on the updated state of charge and the temperature information when the operation state of the secondary battery is set to the calendar state by the second subprocess.

5. The apparatus for estimating a capacity retention rate of a secondary battery according to claim 4, wherein the memory is further configured to store a plurality of calendar degree-of-aging profiles, and
wherein the fourth subprocess includes:
a fourth routine for selecting one calendar degree-of-aging profile matched to the updated state of charge and the temperature information from the plurality of calendar degree-of-aging profiles;
a fifth routine for determining a second reference equivalent time point related to the selected calendar degree-of-aging profile; and
a sixth routine for updating the degree of calendar aging stored in the memory using the selected calendar degree-of-aging profile based on the second reference equivalent time point.

6. The apparatus for estimating a capacity retention rate of a secondary battery according to claim 1, wherein the second main process includes:
a seventh routine for correcting the degree of cycle aging based on the predetermined weighting factor; and
an eighth routine for estimating the capacity retention rate of the secondary battery based on the degree of calendar aging and the corrected degree of cycle aging.

7. The apparatus for estimating a capacity retention rate of a secondary battery according to claim 1, wherein the predetermined weighting factor is a constant within a range between 0 to 2, determined through experimentation.

8. A battery pack comprising the apparatus for estimating a capacity retention rate of a secondary battery according to claim 1.

9. An apparatus for estimating a capacity retention rate of a secondary battery from a degree of calendar aging and a degree of cycle aging of the secondary battery included in a battery pack, the apparatus comprising:
a control unit configured to receive current information and temperature information of the secondary battery from a sensing unit installed in the battery pack in each cycle having a preset time length, and perform a first main process and a second main process in a sequential order; and
a memory configured to store a predetermined weighting factor, and further store a state of charge, a degree of cycle aging and a degree of calendar aging of the secondary battery updated in each cycle when the first main process is performed,
wherein the first main process includes:
a first subprocess for updating the state of charge stored in the memory based on the current information;
a second subprocess for setting an operation state of the secondary battery to one of cycle state and calendar state based on the current information; and
a third subprocess for updating the degree of cycle aging stored in the memory based on the updated state of charge, the current information and the temperature information when the operation state of the secondary battery is set to the cycle state by the second subprocess,
wherein the second main process includes estimating the capacity retention rate of the secondary battery based on the predetermined weighting factor, the updated degree of cycle aging and the degree of calendar aging stored in the memory, and
wherein the memory is further configured to store a plurality of cycle degree-of-aging profiles, and wherein the third subprocess includes:
a first routine for selecting one cycle degree-of-aging profile matched to the updated state of charge, the current information and the temperature information among the plurality of cycle degree-of-aging profiles;
a second routine for determining a first reference equivalent time point related to the selected cycle degree-of-aging profile; and
a third routine for updating the degree of cycle aging stored in the memory using the selected cycle degree-of-aging profile based on the first reference equivalent time point.

10. A method for estimating a capacity retention rate of a secondary battery included in a battery pack from a degree of calendar aging and a degree of cycle aging of the secondary battery, the method comprising:
receiving current information and temperature information of the secondary battery from a sensing unit installed in the battery pack in each cycle having a preset time length;
activating a first main process; and
activating a second main process,
wherein the first main process includes:
a first subprocess for updating a state of charge of the secondary battery based on the current information;
a second subprocess for setting an operation state of the secondary battery to one of cycle state and calendar state based on the current information;
a third subprocess for updating a degree of cycle aging based on the updated state of charge, the current information and the temperature information when the operation state of the secondary battery is set to the cycle state by the second subprocess; and
a fourth subprocess for updating a degree of calendar aging based on the updated state of charge and the temperature information when the operation state of the secondary battery is set to the calendar state by the second subprocess, and
wherein the second main process includes estimating the capacity retention rate of the secondary battery based on a predetermined weighting factor, the updated degree of cycle aging and the degree of calendar aging, and
wherein the first subprocess includes integrating a current indicated by the current information over the preset time length and updating the state of charge stored in the memory based on the integrated current and a maximum capacity stored in the memory.

11. The method of claim 10, further comprising storing, in memory, a plurality of cycle degree-of-aging profiles,
wherein the third subprocess includes:
a first routine of selecting one cycle degree-of-aging profile matched to the updated state of charge, the current information and the temperature information among the plurality of cycle degree-of-aging profiles;
a second routine of determining a first reference equivalent time point related to the selected cycle degree-of-aging profile; and
a third routine of updating the degree of cycle aging stored in the memory using the selected cycle degree-of-aging profile based on the first reference equivalent time point.

* * * * *